(12) United States Patent
Kim (10) Patent No.: US 7,443,714 B1
(45) Date of Patent: Oct. 28, 2008

(54) DRAM INCLUDING SEGMENT READ CIRCUIT

(76) Inventor: Juhan Kim, 5890 W. Walbrook Dr., San Jose, CA (US) 95129

( * ) Notice: Subject to any disclaimer, the term of this patent is extended or adjusted under 35 U.S.C. 154(b) by 0 days.

(21) Appl. No.: 11/877,044

(22) Filed: Oct. 23, 2007

(51) Int. Cl.
*G11C 11/24* (2006.01)

(52) U.S. Cl. ............. 365/149; 365/189.05; 365/189.15; 365/189.17; 365/194; 365/207; 365/230.03

(58) Field of Classification Search .................. 365/149, 365/189.05, 189.15, 189.17, 194, 207, 230.03
See application file for complete search history.

(56) References Cited

U.S. PATENT DOCUMENTS

| | | | | |
|---|---|---|---|---|
| 5,357,474 A | * | 10/1994 | Matano et al. | 365/203 |
| 5,822,260 A | * | 10/1998 | Tamaki | 365/203 |
| 6,456,521 B1 | | 9/2002 | Hsu et al. | |
| 6,512,717 B2 | * | 1/2003 | Eto et al. | 365/230.03 |
| 6,930,940 B2 | * | 8/2005 | Haraguchi | 365/203 |
| 7,292,496 B2 | * | 11/2007 | Akiba et al. | 365/226 |

* cited by examiner

*Primary Examiner*—Hoai V Ho (57) ABSTRACT

A time-domain sensing scheme is introduced for reading a DRAM cell and bit lines are multi-divided for reducing parasitic loading. Thereby lightly loaded bit line is quickly charged by a selected memory cell when reading data "1". The charged voltage is amplified by a segment read circuit, which quickly changes an output of a block read circuit. In contrast, the bit line is discharged when reading data "0", so that impedance of the segment read circuit is increased, which slowly changes the output of a block read circuit. Hence, data "1" is arrived early but data "0" is not arrived to a latch circuit, because the latch is locked by a locking signal based on data "1". Furthermore storage capacitor is reduced to drive short bit line only. Additionally, various alternatives are described.

20 Claims, 8 Drawing Sheets

DRAM INCLUDING SEGMENT READ CIRCUIT

FIELD OF THE INVENTION

The present invention relates generally to integrated circuits, in particular to high-speed and high-density DRAM (Dynamic Random Access Memory).

BACKGROUND OF THE INVENTION

For its high-density and relatively short cycle time, the DRAM (Dynamic Random Access Memory) is utilized extensively as a main memory in computer systems, even though DRAM requires refresh cycle to sustain stored data within a predetermined refresh time. As such, the DRAM constitutes a key component that holds sway on the performance of the computer system. Efforts of research and development have been under way primarily to boost the speed of the memory.

Figure 1:
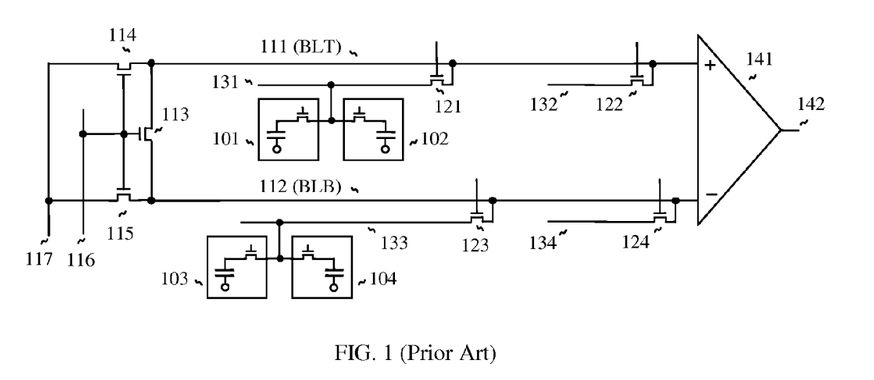
FIG. 1 illustrates a dynamic random access memory, as a prior art.

In the conventional DRAM, hierarchical bit line architecture is applied in order to achieve high-speed operation, as published, "Hierarchical bitline DRAM architecture system" as U.S. Pat. No. 6,456,521, and "A hierarchical bit-line architecture with flexible redundancy and block compare test for 256 Mb DRAM" in VLSI Circuits, Digest of Technical Papers, May 1993. pp 93-94. More specifically, FIG. 1 illustrates a circuit diagram of the conventional DRAM. The memory cells 101 and 102 are connected to a local bit line 131, and the memory cells 103 and 104 are connected to another local bit line 133, where the plate of capacitor is connected half VDD typically. Local bit lines 131 and 133 are connected to a global bit line (BLT) 111 and another global bit line (BLB) 112 through transfer transistors 121 and 123, respectively. And more local bit lines 132 and 134 are connected to the global bit lines 111 and 112, respectively. When reading, one of memory cells is selected, and the selected cell charges or discharges the local bit line while the local bit lines and the global lines are released from pre-charge node 117, such that equalizer transistor 113, pre-charge transistors 114 and 115 are turned off by control signal 116. Thus, one of global bit lines is also charged or discharged by the selected memory cell. After then sense amplifier 141 is activated to generate read output 142. However, the selected global bit line is slowly changed because the selected memory cell should drive local bit line and global bit line through transfer transistor. Moreover, the storage capacitor in the memory cell should be relatively big in order to absorb the charges from the global bit line, which is one of major obstacles to reduce the DRAM cell. As a result, access time is also slow because of heavy global bit line, which increases propagation delay and sensing time for the sense amplifier.

In this respect, there is still a need for improving the dynamic random access memory, in order to achieve fast access and reduce cell area. In the present invention, the bit lines are multi-divided bit line to reduce the parasitic capacitance of the local bit line, and a segment read circuit is added for reading the local bit line more effectively, because the segment read circuit is composed of a few transistors to insert in the memory array. And, a time-domain sensing scheme is introduced in order to differentiate low voltage data and high voltage data in the time-domain, which does not require the conventional sense amp.

And one of major advantages of the present invention is that there is no need for forming extreme feature size transistors because the memory cells can be stacked over the control circuit. In stead of scaling the transistors to extreme geometry, topping memory cells including thin film transistor is more practical, which also achieves fast access with centralized control and short routing length in vertical direction. As a result, there is no scaling limit to fabricate the memory chip by topping multiple memory cells. More detailed explanation will be followed as below.

SUMMARY OF THE INVENTION

In the present invention, dynamic random access memory including segment read circuit is described. In order to achieve fast read operation, multi-divided bit line architecture is introduced, which reduces the parasitic capacitance of local bit line. By reducing bit line loading, the bit line is quickly changed when reading or writing data, because the memory cell only drives a lightly loaded local bit line, which means that the memory cell can be miniaturized further.

Furthermore, segment read circuit is added for amplifying bit line voltage, and multiple segment read circuits are connected to a block read circuit. Hence, the block read circuit determines read output based on amplified output from the segment read circuit, and transfers the read data to a latch circuit through a read path. In particular, time-domain sensing scheme is introduced to differentiate low voltage data and high voltage data, such that a reference signal is generated by reference cells, which signal serves as a locking signal for the latch circuit in order to reject latching one of slow data. For example, high voltage data is arrived first while low voltage data is arrived later. This means that the arriving time reflects the stored data between low voltage data and high voltage data.

And a delay circuit is added for generating the locking signal from the reference signal because there is a need for adding a predetermined delay time before locking the latch circuit with the statistical data for all the memory cells such as mean time between fast data and slow data, in order to compensate cell-to-cell variations. Thereby the delay circuit generates a delay for optimum range of locking time. The read output from the memory cell is transferred to the latch circuit through a returning read path, thus the access time is equal regardless of the location of the selected memory cell, which is advantageous to transfer the read output to the external pad at a time.

The time-domain sensing scheme effectively differentiate low voltage data and high voltage data with time delay control, while the conventional sensing scheme is current-domain or voltage-domain sensing scheme. In the convention memory, the selected memory cell discharges the bit line, and the discharged voltage of the bit line is compared by a comparator. Now in the present invention, there is one more converting step to read the data, such that the selected memory cell discharges the local bit line, the segment read circuit amplifies the voltage of the bit line, and the voltage data is converted to time difference by the block read circuit. Furthermore, the block read circuit is tunable for the voltage conversion more effectively. As a result, the read output of the block read circuit is reached to the latch circuit through the returning data path. In doing so, fast data is reached to the latch circuit earlier, while slow data is rejected by the locking signal which is based on fast data. There are many advantages to adopt the time-domain sensing scheme, so that the sensing time is easily controlled by the tunable delay circuit, which compensates wafer-to-wafer variation as well. Furthermore, this circuit technique is also useful for sensing weak cell transistors with small geometry.

Furthermore, various alternative configurations are described. And, example memory cell layout and cross sectional views are illustrated to minimize cell area.

Still furthermore the fabrication method is compatible with the conventional CMOS process for forming planar type memory cell. Alternatively, stacked type memory cells can be formed in between the routing layers in order to reduce chip area, and also the memory cells can be stacked over the control circuits including MOS transistors when the memory cells are composed of thin-film transistor such as polysilicon with low temperature process, because thin film transistor can drive lightly loaded bit line for read operation, and then strong segment read circuit amplifies the local bit line voltage.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings which are incorporated in and form a part of this specification, illustrate embodiments of the invention and together with the description, serve to explain the principles of the invention.

DETAILED DESCRIPTION OF PREFERRED EMBODIMENT(S)

Reference is made in detail to the preferred embodiments of the invention. While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 2:
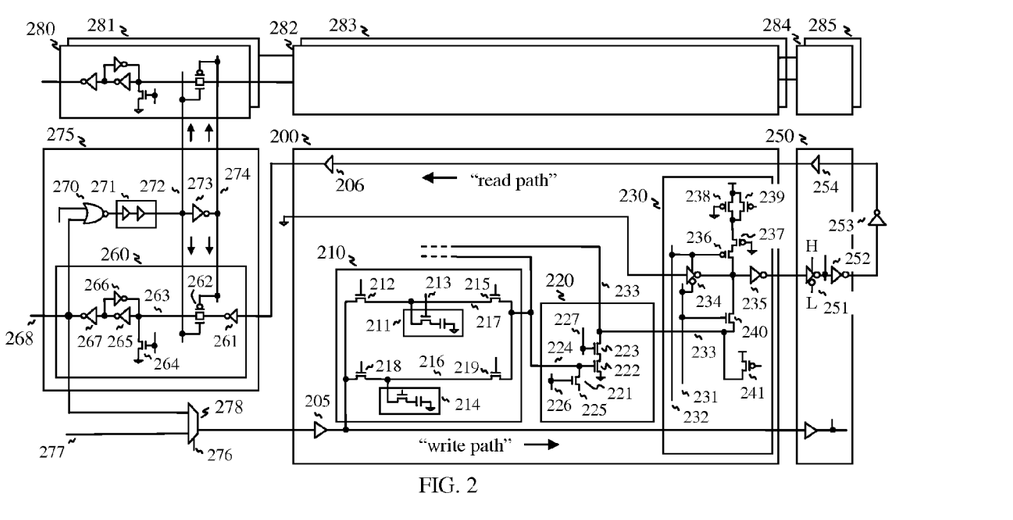
FIG. 2 illustrates a time-domain sensing scheme for DRAM including segment read circuit, according to the teachings of the present invention.

The present invention is directed to high-speed DRAM including segment read circuit, as shown in FIG. 2, wherein a memory block 200 is composed of a memory cell array 210, a segment read circuit 220, a block read circuits 230, a write buffer 205 and a read buffer 206. The block read circuit 230 is connected to multiple segment read circuits, wherein the segment read circuit 220 is connected to multiple memory cell arrays in order to reduce chip area, even though the drawing illustrates only one memory cell array. The memory cell array 210 comprises a write transfer transistor 212 to write data to a memory cell 211, and another write transfer transistor 218 to write data to a memory cell 214, the segment read circuit 220 including a segment read transistor 222 and a segment select transistor 223 to read the data through read transistors 215 and 219. In particular, local bit lines 216 and 217 are lightly loaded by introducing multi-divided bit line architecture, so that weak memory cell drives only lightly loaded bit line during read, while strong segment read circuit discharges heavily loaded block read line 233. And a few memory cell arrays can be connected to a segment read line 224, but the segment read line 224 is still lightly loaded because the segment read line is localized. The write buffer 205 receives output of a data selector 278 to write data.

During standby, the local bit lines 216 and 217 are floating but leakage current through the pass transistors discharges the local bit line near ground. Thus the selected bit line 217, for example, is pre-charged to VPRE (near half VDD voltage) by turning on the read transfer transistor 215, in order to read data. Then, the pre-charge transistor 221 is turned off to release the selected bit line 217 while the read transfer transistor 215 keeps turn-on state and the write transfer transistor 212 keeps turn-off state. Thereby the selected bit lint 217 is in floating state but pre-charged at half VDD level. After then, the memory cell 211 is turned on by a word line 213, so that the selected local bit line is changed by stored charges of the memory cell. Thus, the changed voltage of the local bit line 217 is transferred to the segment read transistor 222 through the transfer transistor 215 and the segment read line 224. And the segment read circuit 220 amplifies voltage output of the segment read line 224, when the segment select transistor 223 is turned on by asserting a segment select signal 227 to high. When the memory cell stores data "1", the local bit line voltage is slightly raised from the pre-charged voltage at half VDD level (500 mV), such that the selected local bit line 217 is raised to 600 mV from 500 mV, for instance. In contrast, when the memory cell stores data "0", the local bit line voltage is slightly lowered from the pre-charged voltage at half VDD level (500 mV), such that the selected local bit line 217 is lowered to 400 mV from 500 mV.

The segment read transistor 222 quickly discharges the block read line 233 when reading data "1", because the gate voltage of the segment read transistor is 600 mV, but the segment read transistor slowly discharges the block read line when reading data "0", because the gate voltage of the segment read transistor is 400 mV, for example. During standby, the block read line 233 is pre-charged to VDD voltage by pre-charge transistor 241. Then, the block read line 233 is lowered near ground by the segment read circuit 220, when read data "1", because block select transistors including NMOS transistor 240 and PMOS transistor 236 are turned on for the selected block 200, and the strength of the segment read circuit 220 is much stronger than that of pull-up transistors 236, 237 and 238. Furthermore, the pull-up strength is tunable with select transistor 238A, and more selectable transistors can be added even though the drawing includes only one tunable pull-up transistor. Thereby, an amplifier is composed of the segment read circuit as amplify device and the pull-up transistors as active load, in order to amplify the bit line voltage. Thus, a read inverter 235 receives the output of the amplifier. By lowering the block read line, voltage output of an inverting read buffer 235 is changed by the block read line, so that the read output is transferred to a latch circuit 260 through a read path including the tri-state inverter 251, inverters 252 and 253, non-inverting buffers 254 and 205. In this manner, one data is transferred to the latch circuit early, but the other data is transferred later, such that data "1" is arrived first and data "0" is arrived later because of local bit line voltage. Thus data "1" serves as a reference signal to reject latching data "0" in the latch circuit. More detailed explanation will be followed as below. In particular, the read path includes a returning path, so that the arriving time to the latch circuit is almost same regardless of location of the selected cell, as long as the word line receives the address inputs from the latch circuit side and delay time of the address inputs is similar to the read path including multiple buffers (not shown). Furthermore, the returning path is inverted by inverter 253 which compensates the strength of the rise time and the fall time of the buffers. Without inverting, the long read path includes only rising delay, because the rise time and the fall time are not equal in CMOS buffer. Alternatively, the inverting read buffer 235 can be a Schmidt trigger to reject low voltage more effectively, which circuit can be composed of the conventional circuit techniques as published U.S. Pat. Nos. 4,539,489 and 6,084,456, thus detailed schematic is not described in the present invention, wherein an inverting type Schmidt trigger can be used for this application.

In the latch circuit 260, the read output changes the latch node 263 and output 268 to high from low through inverters 265 and 267 because the latch node 263 is pre-charged to low by NMOS 264 before activated. After then, the read output is stored in the latch node 263 with cross coupled inverters 265 and 266. And the output 268 changes NOR gate 270 to low, so that the transmission gate 262 is locked by signal 272 and 274 which are transferred from the output 268 through a tunable delay circuit 271 and inverter 273. Simultaneously, latch circuits 280 and 281 are also locked by the signal 272 and 274, where latch circuits 280 and 281 are composed of same circuits as the latch circuit 260. In doing so, the output 268 serves as a reference signal, which is generated by the reference memory cells, such as the memory cells 211 and 214 which store data "1". Adding delay circuit 271, the reference signal serves as a locking signal, where the delay circuit is tunable for differentiating data "1" and data "0", more effectively, because data "1" is arrived before data "0" is arrived.

Thus, the latch circuit 260 and the delay circuit 271 configure a latch control circuit 275, in order to generate the locking signal. More detailed delay circuit will be explained as below. And the NOR gate 270 is used to generate the reference signal even though one of reference cells is failed, where more than one reference column is added to the memory block even though the drawing illustrates only one reference memory column 200 including the latch circuit 260. In this manner, the read outputs from the main memory block 282, 283, 284 and 285 are stored to the latch circuits 280 and 281 by the locking signals 272 and 274 when activated. Furthermore, the read access time is faster than that of the conventional memory, such that multi-divided bit line architecture is introduced in order to reduce the parasitic capacitance of local bit line. As a result, the sensing scheme including the locking signal is referred to as a "time-domain sensing scheme" with the segment read circuit.

And write operation is executed by the write buffer 205 through transfer transistors 212 and 218, while the read circuits including the segment read circuit 220 and the block read circuit 230 are not activated. Before write, write data is determined by a selector circuit 278 wherein a column decoder signal 276 decides output of the selector 278, such that external data input 277 is selected in order to modify the stored data of the memory cell, or the read output 268 is selected in order to write back, because the stored data in the memory cell is disturbed during read. Furthermore, the write back operation is used to refresh the stored data periodically, because the stored charges are reduced by leakage current.

Another aspect for the operation is that the word line voltage affects the read operation and the write operation, such that the transfer transistors including the word line of the memory cell, the write transfer transistor and the read transistor can be raised to VDD (supply voltage) typically. Thus, the storage node of the memory is pull-up to VDD-VT level because of NMOS threshold voltage drop during write, which affects the read operation as well. In order to avoid NMOS threshold voltage drop, the word line and transfer transistor voltage can be raised to higher than VDD+VT level as the conventional DRAM, alternatively. Hence all the signals are reached to full VDD level when write, which enables to achieve fast access with more charges to the storage node and low impedance of the transfer transistors.

Figure 3A:
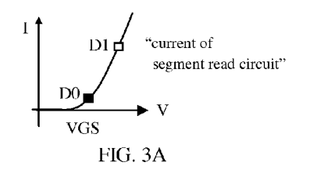
FIG. 3A illustrates an I-V curve of the segment read circuit when reading.
Figure 3B:
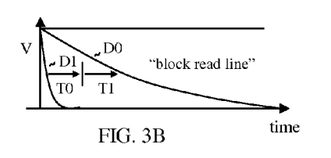
FIG. 3B illustrates discharge time of the block read line.
Figure 3C:
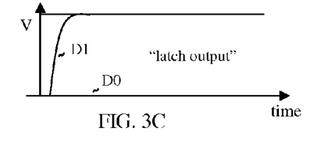
FIG. 3C illustrates read output for data "1" and data "0"

Referring now to FIG. 3A in view of FIG. 2, I-V curve of the segment read circuit 220 is illustrated, wherein data "1" (D1) shows much higher current than that of data "0" (D0) when activated. For example, the local bit line voltage is slightly raised from the pre-charged voltage at half VDD level (500 mV) to 600 mV when the memory cell stores data "1". On the contrary the selected local bit line 217 is slightly lowered to 400 mV from 500 mV. Then the select transistor 223 is turned on in order to measure the current through the segment read circuit. In FIG. 3B, discharge time for the block read line 233 is illustrated, wherein the segment read line 233 is quickly discharged when data "1" (D1) is read. On the contrary, the block read line 233 is slowly discharged when data "0" (D0) is read. In FIG. 3C, the read output 268 is illustrated, such that data "1" (D1) is raised to high within a predetermined time, but data "0" (D0) is not arrived because it is rejected to be latched as explained above.

Figure 3D:
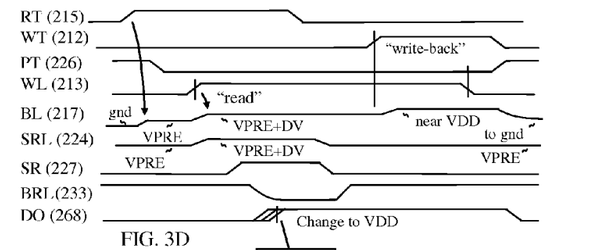
FIG. 3D illustrates read data "1" timing diagram.

Referring now to FIG. 3D in view of FIG. 2, detailed timing for reading data "1" is illustrated. In order to read data, the selected bit line is quickly charged to half VDD voltage by turning on the read transfer transistor (RT) 215, because the local bit line (BL) 217 is floating during standby, and which is lightly loaded with multi-divided bit line architecture. After charging, the local bit line 217 is released and floating from pre-charge node 225 by lowering the pre-charge control signal (PT) 226. After then the word line 213 is raised to predetermined voltage in order to measure the stored charge. And, the segment read (SR) signal 227 is asserted to high in order to turn on the segment select transistor 223. Hence the block read line 233 is quickly discharged when the segment read line 224 is slightly raised to VPRE+DV level where the pre-charge voltage of the local bit line 217 is at VPRE (near half VDD level) and DV is changed voltage by the stored charges in the memory cell 211. Then, the block read line (BRL) 233 is pulled down near ground level by the segment read circuit 220 even though the pull-up transistors 236, 237 and 238 resist to change the block read line, because the pull-down transistors of the segment read circuit 220 is much stronger than the pull-up transistors, where block select transistor 240 is turned on for the selected block 200. Pulling down the block read line 233 near ground voltage, the output of read inverter 235 is changed to high from low, and which output is transferred to output node (DO) 268 through the returning read path. During read operation, there is no phase control signal such that the memory cell data is immediately transferred to the output node 268 through the read path. More specifically, the segment select transistor 223 is turned on to measure the local bit line voltage after the charges are re-distributed by the stored charges of the selected memory cell. Then, the block read circuit 230 waits until the segment read circuit 220 discharges the block read line 233, even though the block read circuit activated around same with the segment read circuit to reduce waiting time (not shown). When the segment read circuit discharges strongly the block read line 233, the block read circuit detects the change and transfers to the latch circuit. Otherwise, the block read circuit keeps the pre-charge state, so that read control is relatively simple, which also realizes fast access with no extra waiting time. Furthermore, the segment read transistor 222 can include lower threshold voltage MOS transistor than that of other peripheral circuits, in order to achieve fast discharging the block read line. After reading the data, all the control signals including the pre-charge control (PT) signal 226 and other control signals are returned to pre-charge state or standby mode.

Figure 3E:
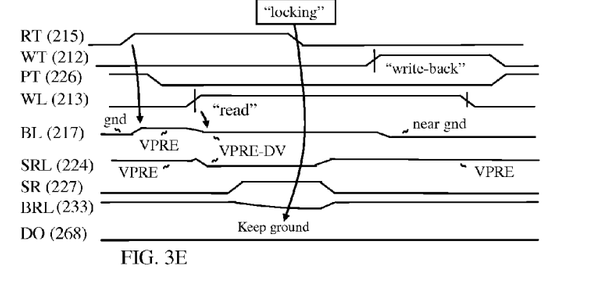
FIG. 3E illustrates read data "0" timing diagram, according to the teachings of the present invention.

Referring now to FIG. 3E, detailed read timing for reading data "0" is illustrated, wherein the segment read circuit 220 slowly discharges the block read line 233 because the segment read line (SRL) 224 is slightly lowered to VPRE-DV level from pre-charge voltage VPRE. Hence the read output 268 is not changed by the block read line 233 whether the read buffer 235 detects the change of the block read line or not, because the locking signal 272 and 274 locks the latch 280 and 281 in order to reject the late signal based on data "0". To do so, a reference signal is generated by fast data (data "1") with delay time as shown TO in FIG. 3B, so that the timing margin Ti is defined to reject slow data (data "0"). In this manner, the time-domain sensing scheme can differentiate data "1" and data "0" within the time domain. This is obvious that the discharge current "i" through the segment read circuit is defined as i=C*dv/dt, which is converted to dt=C/dv/i. Thereby, the discharge time "dt" is proportional to the discharge current inversely where the block read line capacitance "C" and the discharge voltage "dv" are fixed to turn on the read buffer 235, which means that the discharged voltage of the selected bit line is transferred to the segment read line, the segment read line controls the segment read circuit which discharges the block read line, and discharge time is detected by the block read circuit, so that the reference signal based on fast data is used to generate a locking signal to sense slow data in the time domain.

Figure 4:
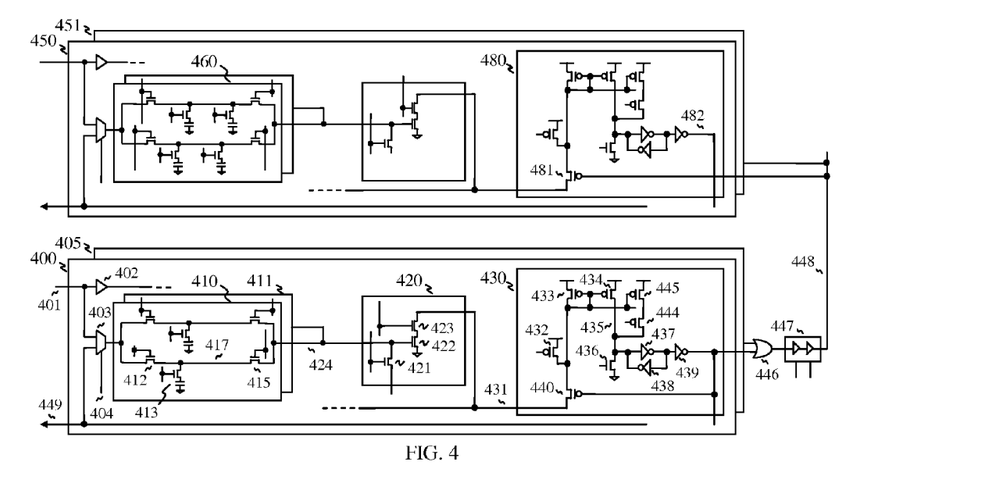
FIG. 4 illustrates the time-domain sensing scheme including a current mirror as a block read circuit, according to the teachings of the present invention.

In FIG. 4, alternative configuration including a current mirror as a block read circuit is illustrated. A memory block 400 includes a memory array 410 and 411, a segment read circuit 420, a write buffer 402, a write selector 403, and a block read circuit 430. The write path includes the write selector 403, such that the selector 403 selects external data or internal data to write or refresh with column control signal 404. The block read circuit 430 is composed of a current mirror circuit and a latch circuit, wherein the current mirror is composed of a pull-up transistor 433 and a current mirror (repeater) 434, and the latch circuit is composed of two cross coupled inverters 437 and 438. Additionally, the pull-down strength of the current repeater is tunable with multiple repeaters including PMOS 445 which is selected by PMOS switch 444, and more current repeaters can be added even though the drawing illustrates only one selectable repeater. The pull-up transistor 433 is connected to the segment read circuit 420 through the block read line 431 and PMOS switch 440, and a pre-charge transistor 432. When a memory cell 413 is selected, write transfer transistor 412 is turned off to release selected local bit line 417, and then read transfer transistor 415 is turned on to pre-charge to VPRE, while unselected local bit lines keep pre-charge state with write transfer transistor, and write circuit 403 provides a constant voltage. After the local bit line 417 is fully pre-charged to VPRE voltage through the read transfer transistor 415 and pre-charge transistor 421, the memory cell 413 is turned on to measure the stored voltage. Hence, the local bit line 417 is slightly higher than VPRE voltage when the stored data is "1", which is fast data, because the segment read circuit 420 quickly pulls down the block read line 431 while the switch 440 is turned on and the pre-charge transistor 432 is turned off. Thereby, the latch node 435 is changed to high from the pre-charged voltage, where the pre-charge transistor 436 is turned off during read. By raising the latch node 435, the inverters 437 and 439 are changed, and the logic states are stored in the latch circuit including two cross coupled inverters 437 and 438. And inverter output signal 439 is transferred to OR gate 446. Furthermore, the OR gate 446 receives multiple signals from other memory block 405, so that the signal is generated only if at least one reference cell works correctly, which signal serves as a reference signal. Then a tunable delay circuit 447 adds a delay time for optimizing the reference signal. Thus, the tunable delay circuit output 448 serves as a locking signal to lock the latch circuits 453 in the main memory block 450 and 459, where the main memory blocks 450 and 459 include same configuration as the reference memory block 400 and 405, except the stored data in the reference memory block 400 is fast data to generate the reference signal. Thus the main memory blocks receive the locking signal 448 in order to reject slow data.

On the contrary, when data "0" is stored in the memory cell array 460 in the main memory block 450, the latched out 482 is not changed because a feedback transfer transistor 481 is turned off by the locking signal 448 from the memory block 400 and 405 which serve as reference memory blocks to generate a locking signal based on fast data. And more main memory blocks, such as another main memory block 451, can be added to increase density. Advantage of using current mirror as a block read circuit is that the current path through the segment read circuit is short by a direct feedback of the output of the current mirror, which reduces current consumption with short feedback path during read operation. This configuration is more useful when the memory block is relatively small.

Figure 5:
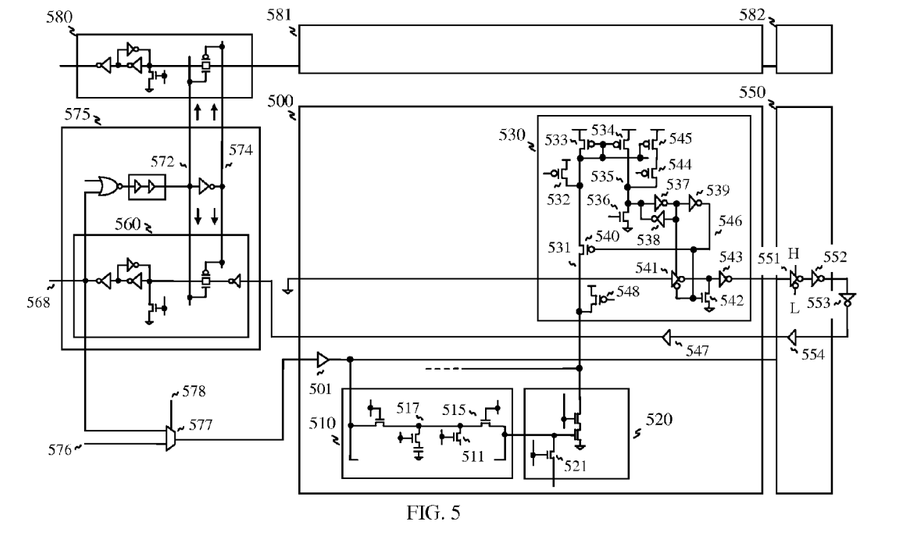
FIG. 5 illustrates the time-domain sensing scheme for configuring a big memory bank, according to the teachings of the present invention.

In FIG. 5, alternative configuration including a current mirror as a block read circuit in a memory bank including multiple memory blocks is illustrated. Memory arrays 500, 550, 581 and 582 configure a relatively big memory bank. The memory block 500 includes memory cell array 510, a segment read circuits 520, and a block read circuits 530. The memory cell array alternatively includes a pre-charge 511 to set the local bit line 517 directly, even though the segment pre-charge transistor 521 sets the local bit line 517 through the read transistor 515. The block read circuit 530 is composed of a current mirror circuit and a latch circuit, wherein the current mirror is composed of a pull-up transistor 533 and a current repeater 534, and the latch circuit is composed of two cross coupled inverters 537 and 538. Additionally, the pull-up strength of the current repeater can be tunable with multiple repeaters including PMOS 545 which is selected by PMOS switch 544. The pull-up transistor 533 is connected to the segment read circuit 520 through the block read line 531 and PMOS switch 540, and a pre-charge transistor 532. When fast data is read, the segment read circuit 520 quickly pulls down the pull-up transistor 533 while the switch 540 is turned on and the pre-charge transistor 532 is turned off. Hence, the latch node 535 is changed to high from the pre-charged voltage, where the pre-charge transistor 536 is turned off during read. By lowering the latch node 535, the inverters 537 and 539 are changed, and the logic state is stored in the cross coupled inverters 537 and 538. Then the latched data disables a tri-state inverter 541 and the latched data 546 turns on NMOS 542. Turning on NMOS 542, output of inverter 543 is changed to high from low. And the output is transferred to the latch control circuit 575 through the read path including tri-state inverter 551, inverters 552 and 553, non-inverting buffers 554 and 547, where the latch control circuit 575 is the same circuit as 275 in FIG. 2, including a latch circuit 560 and locking signals 572 and 574. As a result, the locking signals 572 and 574 are generated to lock latch circuit 580. In order to write data, a write buffer receives input data from a selector 577, such that external input 576 is selected to modify the memory cell data or the read output 568 is selected to write back by a select control signal 578. Advantage of using current mirror as a block read circuit is that the current path through the segment read circuit is directly cut off by its own feedback of the output of the current mirror, which reduces more current consumption during read operation with very short feedback path.

Figure 6:
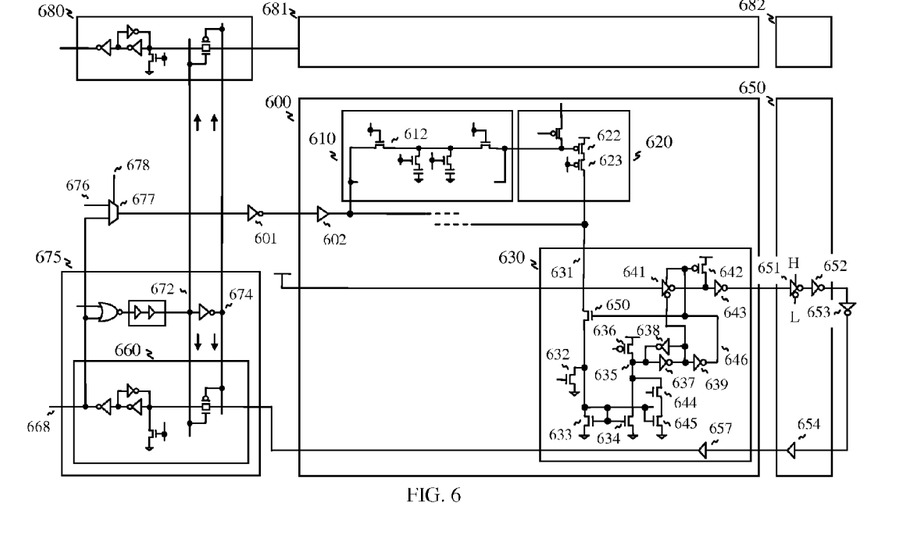
FIG. 6 illustrates the time-domain sensing scheme with reverse configuration, according to the teachings of the present invention.

In FIG. 6, a reverse configuration including a pull-down current mirror as a block read circuit in a memory bank including multiple memory blocks is illustrated. Memory blocks 600, 650, 681 and 682 configure relatively big memory bank. The memory block 600 includes memory cell array 610, a segment read circuits 620, and a block read circuits 630. The block read circuit 630 is composed of a current mirror circuit and a latch circuit, wherein the current mirror is composed of a pull-down transistor 633 and a current repeater 634, and the latch circuit is composed of two cross coupled inverters 637 and 638. Additionally, the pull-down strength of the current repeater can be tunable with multiple repeaters including NMOS 645 which is selected by NMOS switch 644. The pull-down transistor 633 is connected to the segment read circuit 620 through the block read line 631 and NMOS switch 640, and a pre-charge transistor 632. When fast data is read, the segment read circuit 620 including PMOS transistors 622 and 623 quickly pulls up the pull-down transistor 633 while the switch 640 is turned on and the pre-charge transistor 632 is turned off. Hence, the latch node 635 is changed to low from the pre-charged voltage, where the pre-charge transistor 636 is turned off during read. By lowering the latch node 635, the inverters 637 and 639 are changed, and the logic state is stored in the cross coupled inverters 637 and 638. Then the latched data disables a tri-state inverter 641 and the latched data 646 turns on PMOS 642. Turning on PMOS 642, output of inverter 643 is changed to low from high. And the output is transferred to the latch control circuit 675 through the read path including tri-state inverter 651, inverting buffers 652 and 653, and non-inverting buffers 654 and 657, where the latch control circuit 675 is the similar circuit as 275 in FIG. 2 (except no input inverter 261), including a latch circuit 660 and locking signals 672 and 674. As a result, the locking signals 672 and 674 are generated to lock latch circuit 680. In order to write data, internal write buffer 602 receives an inverted output from an input buffer 601 which is added for inverting write data, because the segment read circuit is composed of PMOS transistors, thus PMOS segment read circuit 620 pull-ups the block read line 631 strongly when the local bit line voltage is lower. And then the input buffer 601 receives input data from a selector 677, such that external input 676 is selected to modify the memory cell data or the read output 668 is selected to write back by a select control signal 678. Advantage of using current mirror as a block read circuit is that the current path through the segment read circuit is directly cut off by its own feedback of the output of the current mirror, which reduces more current consumption during read operation with very short feedback path.

Figure 7:
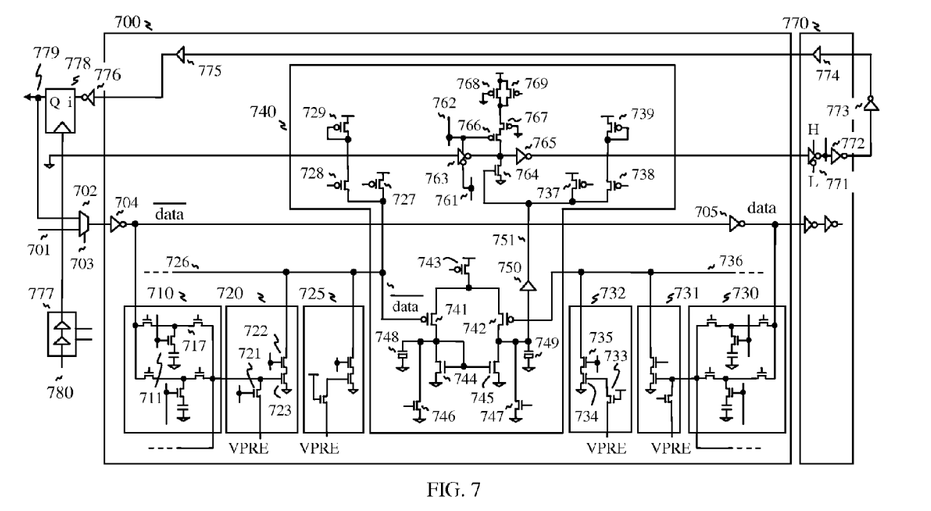
FIG. 7 illustrates alternative configuration with comparator as a block read circuit, according to the teachings of the present invention.

In FIG. 7, alternative configuration with a comparator as a block read circuit is illustrated, wherein a comparator 740 is composed of a differential amplifier. The comparator 740 receives a pairs of block read lines 726 and 736 from selected memory cell array 710 and unselected memory cell array 730, respectively. The segment read circuit 720 configures an amplifier with pull-up transistors 727, 728 and 729 as active load, for reading the selected memory cell array 710. Thereby the amplifier output 726 serves as the block read line, which amplifies the potential of a selected local bit line 717. And the local bit line 717 is driven by a selected memory cell. The selected segment read circuit 720 is composed of a read transistor 722, select transistor 723 and pre-charge transistor 721 to amplify the local bit line voltage. On the contrary, another input 736 for the comparator 740 is generated by a reference circuit 732, which is composed of same circuit as the segment read circuit 720, but a reference signal is asserted to the read transistor 734 through the pre-charge transistor 733 which is always turned on and receives pre-charge voltage VPRE (for example, half VDD voltage). And the select transistor 735 is turned on for generating a reference voltage 736, which configure an amplifier with pull-up transistors 737, 738 and 739. And unselected memory cell array 730 and unselected segment read circuit 731 keep pre-charge state. Furthermore, the amplifiers are tunable with selecting the pull-up strength of the transistors 728 and 738 in order to get the reference voltage near half VDD voltage, because the differential amplifier has high gain near half VDD input. Thereby, the read data "1" pulls down the amplifier output lower than half VDD because the local bit line voltage is VPRE+DV voltage as explained above. Otherwise, the read data "0" generates the amplifier output higher than half VDD because the local bit line voltage is VPRE-DV voltage, while the reference voltage is half VDD voltage for the differential amplifier 740. And more tunable pull-up transistors can be added even though the drawing illustrates two pull-up transistors. In this manner, the differential amplifier differentiates data "1" and "0" with the mid level reference voltage, so that accurate sensing is achieved for small voltage of reduced memory cell, even though the amplifier and the differential amplifier consume current during read operation.

After the amplifier outputs are settled down, the pre-charge transistors 746 and 747 of differential amplifier are turned off, and then the differential amplifier including transistors 741 to 751 is activated by turning on pull-up PMOS 743. Hence, one of receiving transistors 741 and 742 quickly pulls up its drain node, while the other transistor pulls down, because of input voltage difference from the block read lines 726 and 736 which are generated by the amplifiers. The differential amplifier has two inputs, so that one input is referred to as a negative input and another input is referred to as a positive input. In order to keep positive polarity, the memory cell array 710 stores negative data because the block read line 726 is connected to negative input transistor 741. Thereby, output from the differential amplifier is recovered to positive polarity. For example, when the stored data in the memory cell 711 is data "1", the selected local bit line 717 is lowered to ground because the storage node of the memory cell stores low voltage, such that the amplifier output 726 is inverted to higher than half VDD voltage. By activating the differential amplifier, the drain node of the receiving transistor 741 and 742 start to changing, but the decoupling capacitors 748 and 749 react to change the drain nodes, so that the decoupling capacitors effectively suppress abrupt change when activated, which helps to reject coupling noise. The coupling capacitor size can be decided depending on the target speed because big capacitor delays the sensing speed while small capacitor does not help filtering noise. After then, the differential output is determined by a non-inverting buffer 750, such that the buffer output 751 is raised to high because the reference amplifier output is near half VDD voltage and the amplifier out 726 is slightly higher than half VDD voltage when read data "1" from the negative side memory array 710. Thereby, the positive receiving transistor 742 pulls up its drain node, while the negative receiving transistor 741 pulls down its drain node. And NMOS active load 744 pulls down its drain node, so that another active load 745 keeps high impedance state. As a result, the output of the differential amplifier generates near "high" output, and then the buffer 750 generates full high voltage based on the differential amplifier output. Alternatively, the buffer 750 can be a Schmidt trigger to determine output voltage more effectively. In contrast, when the memory array 730 in the right side is selected, the reference voltage generator circuit 725 in the left side is activated. And the memory array 730 stores positive data, so that an inverting write buffer 706 inverts output of write buffer 704, and another inverting write buffer 707 inverts again the write data, in order to write positive data in the positive array 730. The read operation is the same as explained above.

After the differential amplifier generates read output 751, a pull-down transistor 764 receives the read output 751 from the differential amplifier, so that an output of an inverter 765 is changed to high, because the pull-down transistor 764 is fully turned on when the read data from the selected memory cell is high, where the strength of pull-up transistors including 766, 767, 768 and 769 is much weaker than that of the pull-down transistor 764. Thereby, the pull-down transistor 764 pulls down its drain only if the read data is "1", which configures another amplifier with pull-up transistors. Otherwise, the pull-down transistor is turned off and the pull-up transistors sustain the input of inverter 765, and the tri-state inverter 763 is turned off for the selected block by block select signals 761 (high) and 762 (low). In contrast, the tri-state inverter 771 in the unselected block 770 is turned on to bypass the read output. Furthermore, the pull-up strength is tunable with selectable PMOS transistor 769 including wide channel, where more tunable pull-up transistors can be added even though the drawing illustrates only one tunable circuit. In doing so, weak turn on of the pull-down 764 is rejected by the pull-up transistors, such that the differential amplifier output is very slightly raised when the differential amplifier is activated typically, because both amplifier outputs moves toward half VDD voltage thus the drain nodes of the receiving transistors are slightly raised. The tunable pull-up transistors effectively reject the weak turn-on during transition time. And furthermore, the slight change is rejected by the buffer 750 including a Schmidt trigger as well. When read data "1", the read buffer 765 transfers the change to the output latch circuit 778, through read path including tri-state inverter 771, inverting buffers 772 and 776, and non-inverting buffers 773 and 774. Then, the read output is stored in the latch circuit 778, and the latch control circuit 777 locks the latch circuit 778, where the latch control circuit 777 receives a read enable signal 780 and the read enable signal is delayed by a tunable delay circuit in the latch control circuit 777. And reverse configuration is also available with PMOS segment read circuit (not shown), such that the configuration for the differential amplifier is also reversed with NMOS receiving transistors.

Figure 8A:
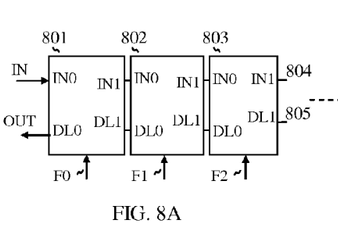
FIG. 8A illustrates a tunable delay circuit.
Figure 8B:
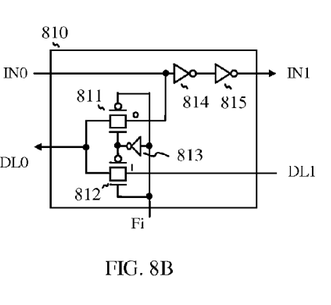
FIG. 8B illustrates a delay unit of the tunable delay circuit.

In FIG. 8A, more detailed a tunable delay circuit (as shown 271 in FIG. 2) is illustrated, wherein multiple delay units 801, 802 and 803 are connected in series, the first delay unit 801 receives input IN and generates output OUT, the second delay unit 802 is connected to the first delay unit, and the third delay unit 803 is connected to the second delay unit 802 and generates outputs 804 and 805, and so on. Each delay unit receives a fuse signal, such that the first delay unit receives F0, the second delay unit receives F1, and the third delay unit receives F2. And more detailed delay unit is illustrated in FIG. 8B, wherein the delay unit 810 receives an input IN0 and a fuse signal Fi, thus the fuse signal Fi selects output from the input IN0 or input DL1, so that a transfer gate 811 is turned on when the fuse signal Fi is low and output of inverter 813 is high, otherwise another transfer gate 812 is turned on when the fuse signal Fi is high and output of inverter 813 is low to bypass DL1 signal. Inverter chain 814 and 815 delays IN0 signal for the next delay unit, where more inverter chains or capacitors can be added for the delay even though the drawing illustrates only two inverters.

Figure 8C:
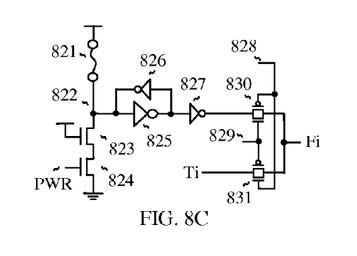
FIG. 8C illustrates a related fuse circuit of the tunable delay circuit.

In FIG. 8C, a related fuse circuit of the tunable delay circuit (as shown in FIG. 8A) is illustrated in order to store information for the delay circuit, so that a fuse serves as a nonvolatile memory, wherein a fuse 821 is connected to a latch node 822, a cross coupled latch including two inverters 825 and 826 are connected to the latch node 822, pull-down transistors 823 and 824 are serially connected to the latch node 822 for power-up reset. Transfer gate 830 is selected by a select signal 829 (high) and another select signal 828 (low) in order to bypass the latch node 822 through inverter 825 and 827. In doing so, fuse data is transferred to output node Fi, otherwise test input Ti is transferred to Fi when a transmission gate 831 is turned on.

Figure 8D:
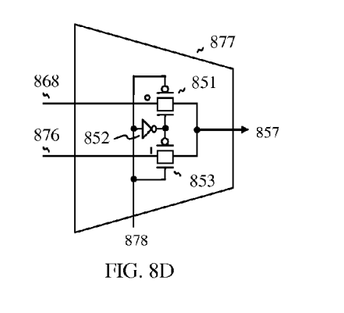
FIG. 8D illustrates a selector circuit, according to the teachings of the present invention.

In FIG. 8D, a detailed selector circuit is illustrated for selecting external input data or internal refresh data for the selector circuit 278 as shown in FIG. 2, wherein external input 876 is selected when a select control signal 878 is asserted to high, or the read data 868 from the memory cell is selected when a select control signal 878 is asserted to low.

Methods of Fabrication

The memory cell can be formed on the surface of the wafer. And the steps in the process flow should be compatible with the current CMOS manufacturing environment as the prior arts, such as U.S. Pat. No. 6,297,090, U.S. Pat. No. 6,573,135 and U.S. Pat. No. 7,091,540 for forming DRAM memory cell. Alternatively, the memory cells can be formed in between the routing layers. In this manner, fabricating the memory cells is independent of fabricating the peripheral circuits on the surface of the wafer. In order to form the memory cells in between the metal routing layers, LTPS (Low Temperature Polycrystalline Silicon) can be used, as published, U.S. Pat. No. 5,395,804, U.S. Pat. No. 6,852,577 and U.S. Pat. No. 6,951,793. The LTPS has been developed for the low temperature process (around 500 centigrade) on the glass in order to apply the display panel, according to the prior arts. Now the LTPS can be used as a thin film transistor for the memory device. The thin film based cell transistor can drive multi-divided bit line which is lightly loaded, even though thin film polysilicon transistor can flow less current than single crystal silicon based transistor on the surface of the wafer. During LTPS process, the MOS transistor in the control circuit and routing metal are not degraded. In this respect, detailed manufacturing processes for forming the memory cells, such as width, length, thickness, temperature, forming method, or any other material related data, are not described in the present invention.

Figure 9A:
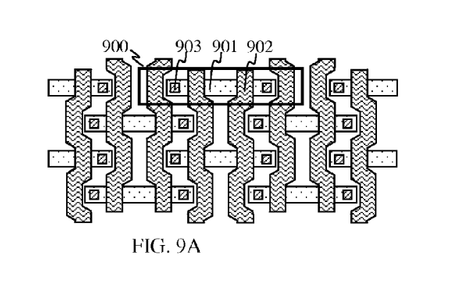
FIG. 9A, 9B, 9C and 9D illustrate an example layout for the memory cell, according to the teachings of the present invention.
Figure 9B:
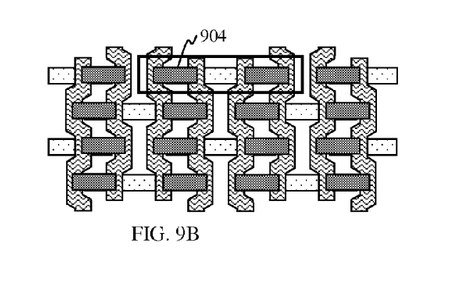
Figures 9C, 9D:
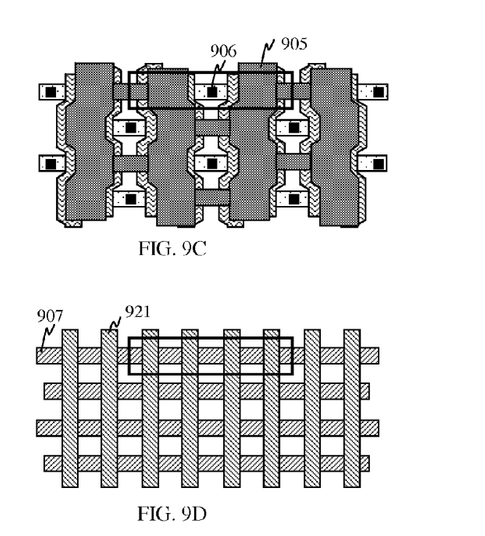

In FIG. 9A, 9B, 9C and 9D, example layouts for configuring memory cell array are illustrated. A solid line 900 depicts two identical memory cells, where two memory cells are symmetrically formed in order to share an active region 901. In the process steps, the active region 901 is formed first, and then gate region 902 is formed on the active region. After then capacitor contact region 903 is formed as shown in FIG. 9A. Then, insulation layer is formed on the storage node 904. The storage node 904 is formed on the capacitor contact region 903 as shown in FIG. 9B. The capacitor plate region 905 is formed on the storage node 904 as shown in FIG. 9C. After then, metal contact region 906 is formed. In FIG. 9D, first metal layer 907 for the local bit line is formed on the metal contact region 906 in FIG. 9C. And second metal layer 921 for global word line is formed on the first metal layer 907, as shown in FIG. 9D.

Figure 10:
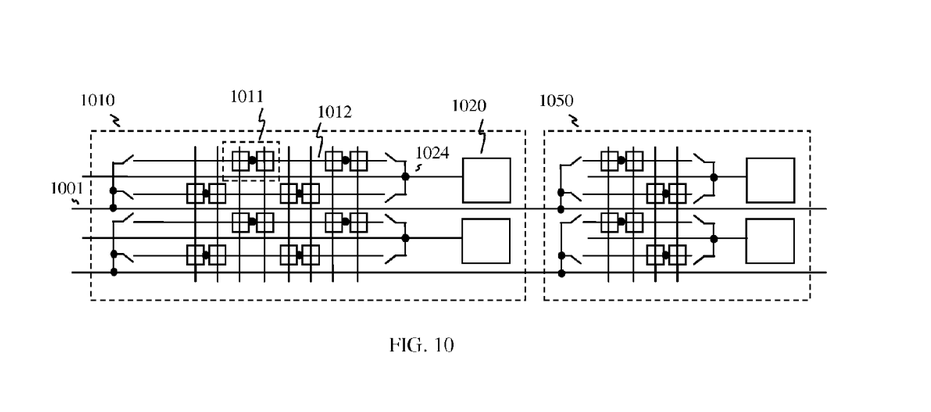
FIG. 10 illustrates more detailed bit line structure for a memory cell array, according to the teachings of the present invention.

More detailed bit line structure is illustrated in FIG. 10, wherein a memory cell pair 1011 is connected to a local bit line 1012, the segment read line 1024 is connected to the local bit line through read transfer transistor and also connected to a segment read circuit 1020 to read data, and a segment write line 1001 is connected to the local bit line through write transfer transistor to write data. Thereby, the segment read line 1024 passes in the middle region over the local bit lines, and the segment write line 1001 passes in the middle region over the local bit lines as well. In the drawing, a segment read circuit 1020 is connected to only two local bit lines. However, a segment read circuit is shared by multiple local bit lines to reduce area in the actual design. And a write buffer (not shown) is also shared by multiple local bit lines in the similar manner. Hence there are multiple memory segments as shown 1010 and 1050 in a memory block.

Figure 11:
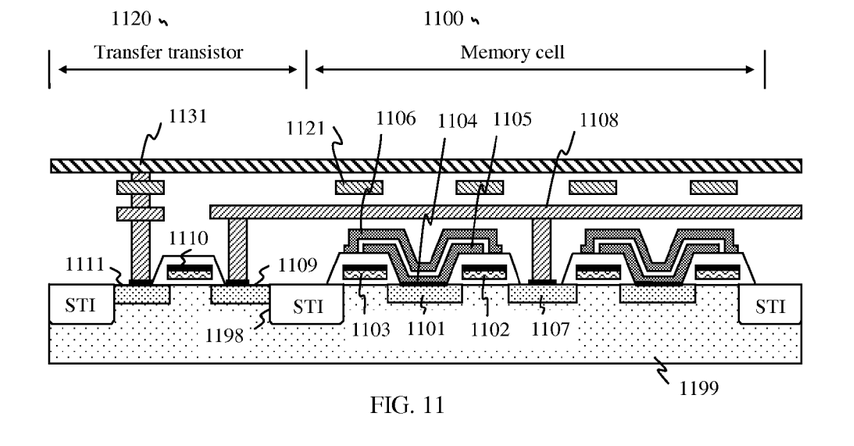
FIG. 11 illustrates an example cross sectional view for the memory cell for obtaining high capacitance, according to the teachings of the present invention.

FIG. 1 illustrates an example cross sectional view for the memory cell for obtaining high capacitance, wherein a capacitor is composed of bottom plate 1105 and top plate 1106 on the gate region, and the capacitor is connected to a drain/source 1101 of a transfer gate 1102 through contact region 1104. And bit line is connected to a drain/source 1107 of the transfer gate 1102. Thus memory cell data is transferred to local bit line 1108 which is composed of metal-1 layer and the local bit line is connected to a read transfer transistor 1110 of the segment read circuit through drain 1109 and source 1111. Then, drain 1111 of the read transfer transistor 1110 is connected to a segment read line 1131 which is composed of metal-3 layer, where global word line 1121 passes under the segment read line 1131. The peripheral circuit region 1120 is placed on the same surface of a substrate 1199, where the memory cell area 1100 is isolated by STI (Shallow Trench Isolation) region 1198. In terms of the storage capacitor, the effective area of the capacitance is increased with three-dimensional structure on the gate region, but there is slight coupling with selected word line (gate) 1102 and passing word line 1103. The coupling noise is negligible only if total storage capacitance is much bigger than the coupling capacitance.

Figure 12A:
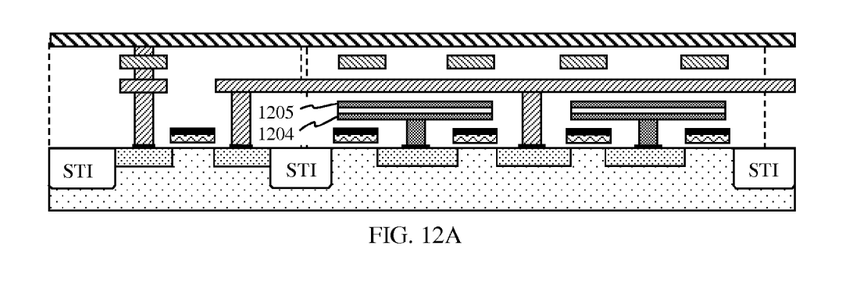
FIG. 12A illustrates an example cross sectional view for the memory cell including flat plates.

FIG. 12A illustrates an example cross sectional view for the memory cell including flat plates, wherein the flat plates 1204 and 1205 configure a capacitor, such that the capacitor serves as a storage element for storing charges. And this structure has coupling noise with word lines but the coupling is negligible portion only if the total capacitance of the capacitor is enough big with good dielectric material. For example, DRAM uses ordinary dielectric capacitor, such as silicon dioxide, silicon nitride, Ta2O5, TiO2, Al2O3, TiN/HfO2/TiN(TIT), and Ru/Insulator/TiN(RIT). And MIM (Metal Insulator Metal) structure can be used for forming the capacitor. Alternatively, ferroelectric capacitor can be used as a storage capacitor, such as lead zirconate titanate (PZT), lead lanthanum zirconium titanate (PLZT), barium strontium titanate (BST), and strontium bismuth tantalate (SBT), where dielectric constant of ferroelectric capacitor is typically high so that effective capacitance is increased.

Figure 12B:
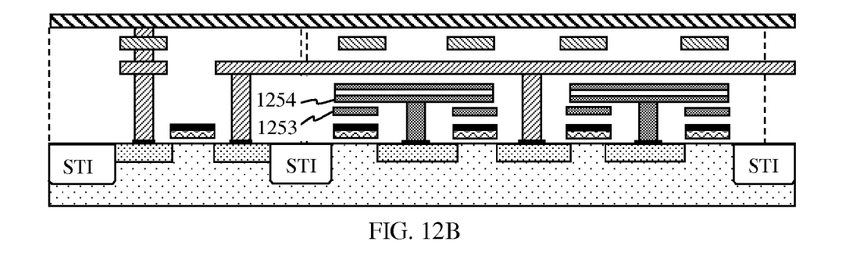
FIG. 12B illustrates an example cross sectional view for the memory cell including three plates, according to the teachings of the present invention.

FIG. 12B illustrates an example cross sectional view for the memory cell including one more plate, wherein additional plate 1253 is formed under the storage palter 1254. Thereby, the storage node 1254 is isolated from the gate layer, which eliminates the coupling noise from the word line. Furthermore total capacitance is increased with the additional plate 1253. And other layers are the same as the structure as shown in FIG. 11.

Figure 13A:
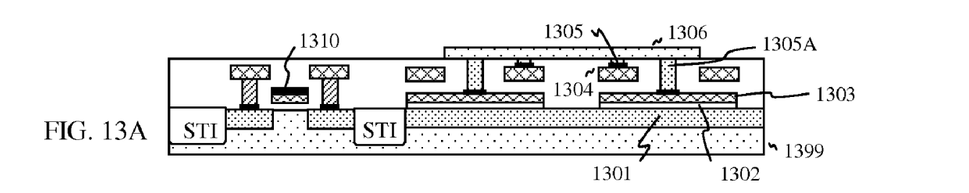
FIG. 13A, 13B and 13C illustrate an example cross sectional view for the memory cell including bottom capacitor, according to the teachings of the present invention.
Figure 13B:
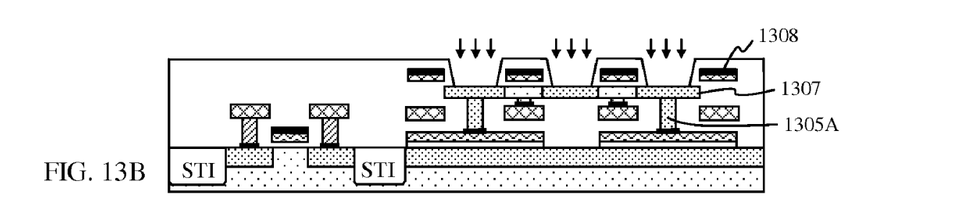
Figure 13C:
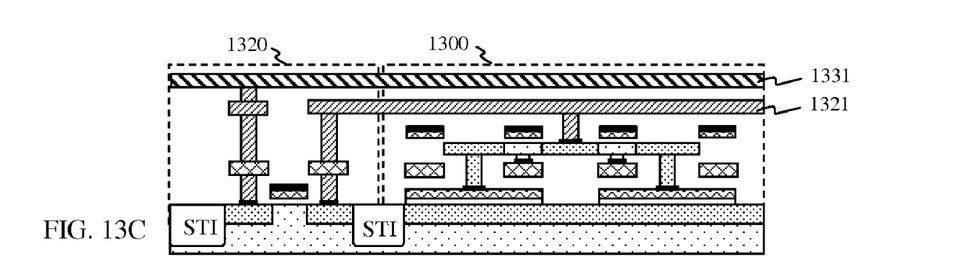

In FIG. 13A, 13B and 13C, an alternative structure is illustrated, wherein the storage capacitor is formed on the active region 1301 in the substrate 1399 to increase the capacitor area with no contact space. Hence, the storage plate 1303 is formed on the insulation layer 1302 and then metal layer 1304 is formed in order to connect the body of the pass transistor, where the polysilicon layer 1306 is formed on the metal layer 1304. Thereby the polysilicon layer 1306 is connected to the metal layer 1304 through contact region 1305 including same type of polysilicon on an ohmic contact region. And storage node is connected to the polysilicon layer 1306 through a contact region 1305A, which contact is separately formed, as shown in FIG. 13A. After then, in FIG. 13B, poly gate region 1308 is formed, and the active region 1307 is counter-doped, which region is also connected to the storage contact region 1305A with same type of polysilicon. Then, in FIG. 13C, local bit line 1321 is formed, and segment read line or global bit line 1331 is formed on the local bit line 1321.

In this structure, peripheral circuit 1320 is formed on the surface of the wafer 1399, but the memory cell 1300 is formed from polysilicon layer, so that the body should be connected to a bias voltage through metal layer 1304, for instance, to a negative voltage, in order to reduce sub-threshold leakage current of the pass transistor.

Figure 14:
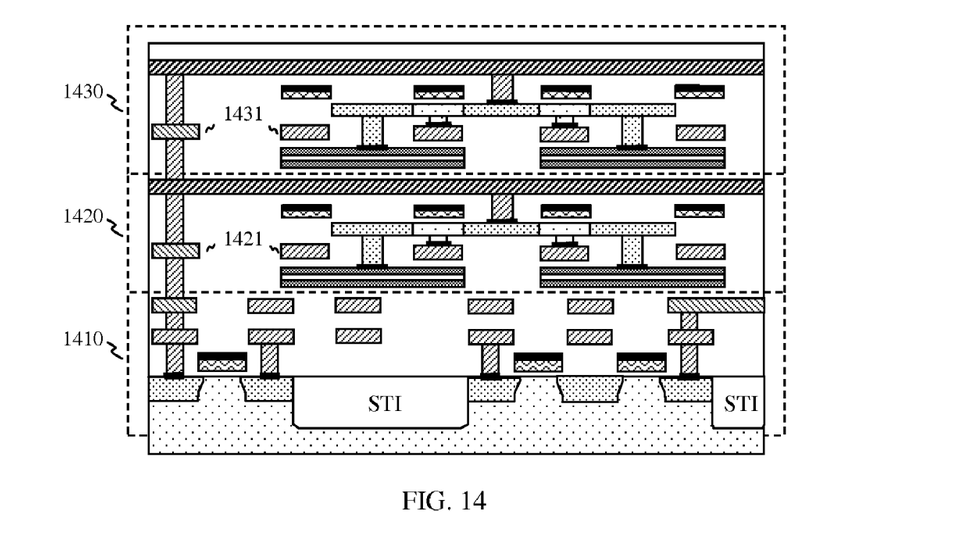
FIG. 14 illustrates an example cross sectional view for stacking memory cells, according to the teachings of the present invention.

In FIG. 14, a cross sectional view is shown, in order to stack multiple memory cells on the peripheral circuits 1410, where the memory cell 1420 is formed on the second floor and another memory cell 1430 is formed on the third floor. And the memory cell structure is the same as that of FIG. 13C except tungsten layer for the bias voltage is converted to regular routing layer for reducing sheet resistance. Hence, the metal layer 1421 and 1431 are formed for biasing the pass transistor, and which layer can be used as routing layer for the peripheral circuits.

Figure 15:
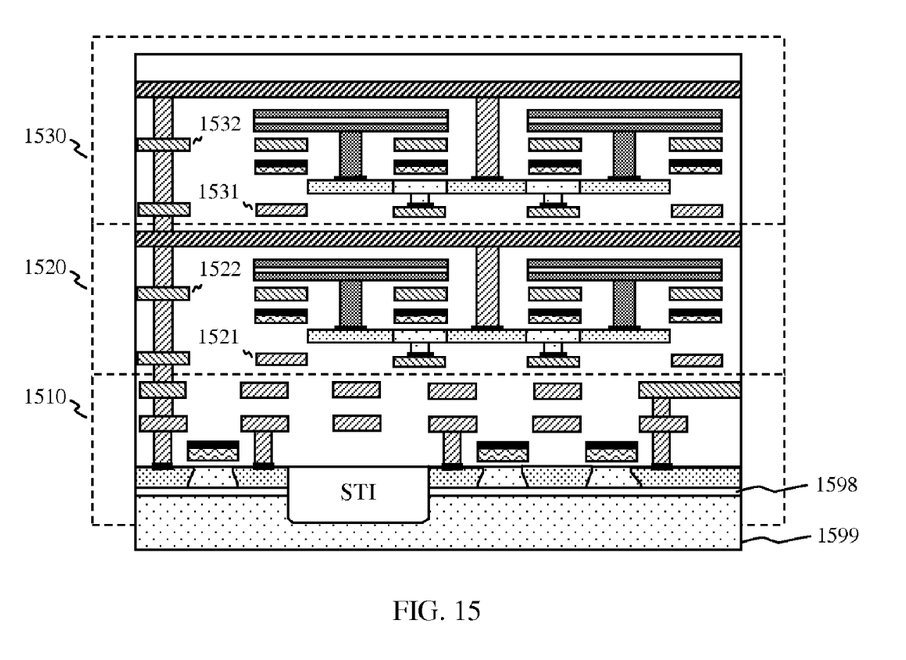
FIG. 15 illustrates another example cross sectional view for stacking memory cells, according to the teachings of the present invention.

In FIG. 15, another cross sectional view is illustrated, where the peripheral circuit 1510 is formed on insulation layer 1598 of the SOI (Silicon on Insulator) wafer 1599. The memory cell 1520 is formed on the second floor and another memory cell 1530 is formed on the third floor. And the memory cell structure is similar to that of FIG. 12B, wherein single crystal based transistor is converted to polysilicon based transistor. And the metal layer 1521 and 1531 are formed for biasing the pass transistor, and which layer can be used as routing layer for the peripheral circuits. Furthermore, metal layer 1522 and 1532 are formed for reducing coupling noise from the word line, which layer can be used as routing layer for the peripheral circuits. And the metal layers 1522 and 1532 are also used to reduce the depth of the metal contacts for forming the memory cells.

CONCLUSION

High-speed dynamic memory is realized, wherein local bit lines are multi-divided to reduce parasitic loading, which achieves fast access with fast discharge time of the local bit line. And a segment read circuit is added to the segmented memory array, such that the segment read circuit configures an amplifier to amplify the local bit line voltage with active load portion of the block read circuit, and the amplifier output is transferred to another amplifier including a current mirror as a receiving transistor in the block read circuit. Furthermore, fast access time is achieved with no extra waiting time for reading the memory cell through the segment read circuit and the block read circuit. And time-domain sensing scheme is introduced to differentiate high voltage data and low voltage data in the memory cell, because one of two data is arrived earlier. Thus, reference signal is generated by reference cells storing fast data such as high data, for instance, which is used to generate locking signal with tunable delay circuit to optimize delay time, so that the locking signal rejects latching low data to a latch circuit.

Furthermore, various alternatives and applications are described. Furthermore, example memory cell layouts and cross sectional views are illustrated to minimize cell area. And the fabrication method is compatible with the conventional CMOS process for forming planar type memory cell with no additional steps. Alternatively, stacked memory cell can be formed in between the routing layers, such that low temperature polysilicon layer can be used as a thin film polysilicon transistor for the pass transistor, which realizes multi-stacked type memory cell can be formed on the peripheral circuit. In addition, various capacitors can be used as the storage element, such as normal capacitor and ferroelectric capacitor. Furthermore, a series capacitor can be a storage element.

While the descriptions here have been given for configuring the memory circuit and structure, alternative embodiments would work equally well with reverse connection such that PMOS transistor can be used as a pass transistor for configuring the memory cell, and signal polarities are also reversed to control the reverse configuration.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A memory device, comprising:
   a memory cell including a pass transistor and a capacitor, which transistor is controlled by a word line;
   a memory cell array wherein a bit line is connected to a plurality of memory cell, a write transfer transistor, and a read transfer transistor, where drain of the read transfer transistor is connected to a segment read line;
   a segment read circuit for configuring an amplifier, wherein a read transistor is connected to a select transistor serially, and a pre-charge transistor is connected to the segment read line, where gate of the read transistor is connected to the segment read line, and drain of the select transistor is connected to a block read line;
   a memory segment wherein the segment read circuit is connected to multiple memory cell arrays;
   a memory block wherein multiple memory segments are connected to a block read circuit through the block read line; and the block read circuit wherein load devices are connected to the block read line through block select transistors, so that the load devices configure the amplifier with the segment read circuit as amplify device; and output of the amplifier is connected to output of a tri-state inverter and input of a read inverter; and the read inverter generates read output based on the output of the amplifier;
   a read path including multiple buffers to transfer the read output of the block read circuit of the memory block;
   a latch circuit storing read output of the memory block through the read path;
   a latch control circuit generating a locking signal to lock the latch circuit.

2. The memory device of claim 1, wherein the segment read circuit is composed of MOS transistor, such as NMOS field effect transistor, PMOS field effect transistor, low threshold NMOS field effect transistor and low threshold PMOS field effect transistor; and alternatively the current mirror of the block read circuit is composed of MOS transistor, such as NMOS field effect transistor, PMOS field effect transistor, low threshold NMOS field effect transistor and low threshold PMOS field effect transistor.

3. The memory device of claim 1, wherein the segment read circuit wherein the read transistor is connected to the select transistor serially, and the pre-charge transistor is connected to the segment read line, where gate of the read transistor is connected to the segment read line, and drain of the select transistor is connected to a block read line; and the segment read line is pre-charged to a predetermined voltage near half of supply voltage.

4. The memory device of claim 1, wherein the block read circuit includes tunable load devices, which load devices are connected to the block read line through block select transistors, so that the load devices configure the amplifier with the segment read circuit as receiving device; and output of the amplifier is connected to output of the tri-state inverter and input of the read inverter; and the read inverter generates read output based on the output of the amplifier.

5. The memory device of claim 1, wherein the block read circuit includes multiple load devices which are tunable with select transistors; and more specifically, the load devices are connected to multiple segment read circuits through the block read line and a feedback transistor in order to configure the amplifier, a current mirror circuit is connected to active loads to receive output of the amplifier in order to store to a cross coupled inverter latch; and first pre-charge transistor is connected to the block read line, second pre-charge transistor is connected to the active loads, third pre-charge transistor is connected to the current mirror; and the feedback transistor is controlled by the output of the cross coupled latch; and the output of the cross coupled inverter latch is connected to an output transfer transistor which is connected to output of a tri-state inverter and input of a read inverter; and the read inverter generates read output.

6. The memory device of claim 1, wherein the block read circuit is connected to multiple segment read circuits through the block read line; and load device is connected to the block read line through a feedback transistor to configure the amplifier, a current mirror is connected to the load device to receive output of the amplifier to a cross coupled inverter latch, thus the block read circuit output is stored in the cross couple inverter latch; and first pre-charge transistor is connected to the block read line, second pre-charge transistor is connected to the load device, and third pre-charge transistor is connected to the current mirror; and the feedback transistor is controlled by the output of the cross coupled latch; and the output of the cross coupled inverter latch is connected to gate of an output transfer transistor which is connected to output of a tri-state inverter and input of a read inverter; and the read inverter generates read output.

7. The memory device of claim 1, wherein the block read circuit includes a tunable current mirror which is adjusted by select transistors; more specifically, active loads are connected to multiple segment read circuits through the block read line and a feedback transistor in order to configure the amplifier; and a tunable current mirror circuit is connected to active loads to receive output of the amplifier in order to store to a cross coupled inverter latch; and first pre-charge transistor is connected to the block read line, second pre-charge transistor is connected to the active loads, third pre-charge transistor is connected to the current mirror; and the feedback transistor is controlled by the output of the cross coupled latch; and the output of the cross coupled inverter latch serves as output of the block read circuit.

8. The memory device of claim 1, wherein the block read circuit includes a tunable current mirror which is adjusted by select transistors; more specifically, active loads are connected to multiple segment read circuits through the block read line and a feedback transistor in order to configure the amplifier; and a tunable current mirror circuit is connected to active loads to receive output of the amplifier in order to store to a cross coupled inverter latch; and first pre-charge transistor is connected to the block read line, second pre-charge transistor is connected to the active loads, third pre-charge transistor is connected to the current mirror; and the feedback transistor is controlled by the output of the cross coupled latch; and the output of the cross coupled inverter latch is connected to an output transfer transistor which is connected to output of a tri-state inverter and input of a read inverter; and the read inverter generates read output.

9. The memory device of claim 1, wherein the block read circuit includes a differential amplifier; more specifically, a receiving transistor of the differential amplifier is connected to the block read line where one block read line is connected to the segment read circuit receiving voltage data from a selected memory cell, and another block read line is connected to another segment read circuit for generating reference voltage; and first load devices are connected to each block read line, so that two identical amplifiers are composed of load devices and segment read circuits; and the output of the differential amplifier is connected to an output transfer transistor through a buffer circuit, which transistor is connected to second load device, output of a tri-state inverter and input of a read inverter; and the read inverter generates read output.

10. The memory device of claim 1, wherein the block read circuit includes a differential amplifier; more specifically, a receiving transistor of the differential amplifier is connected to the block read line where one block read line is connected to the segment read circuit receiving voltage data from a selected memory cell, and another block read line is connected to another segment read circuit for generating reference voltage; and first load devices are connected to each block read line, so that two identical amplifiers are composed of load devices and segment read circuits; and the output of the differential amplifier is connected to an output transfer transistor through a buffer circuit, which transistor is connected to second load device, output of a tri-state inverter and input of a read inverter; and the read inverter generates read output; and the strength of first and second load devices are tunable with multiple transistors.

11. The memory device of claim 1, wherein the read inverter of the block read circuit includes a Schmidt trigger.

12. The memory device of claim 1, wherein the read path includes an inverting returning path.

13. The memory device of claim 1, wherein the latch control circuit includes a tunable delay circuit; and more specifically, the delay circuit receives output of an OR gate receiving reference signals, which signals are generated by multiple memory blocks including reference memory cells, and the delay circuit delays the reference signal to generate a locking signal.

14. The memory device of claim 1, wherein the memory cell array includes the bit line, which bit line is connected to a plurality of memory cell, the write transfer transistor, the read transfer transistor, and the pre-charge transistor, where drain of the read transfer transistor is connected to the segment read line.

15. The memory device of claim 1, wherein the memory cell includes the pass transistor and the capacitor; and the pass transistor is controlled by a word line which has two states where one of the states is higher than supply voltage of the block read circuit.

16. The memory device of claim 1, wherein the memory cell includes the pass transistor and the capacitor, and which capacitor includes bottom plate, middle plate and top plate, where the middle plate serves as storage node while bottom plate and top plate are connected to constant voltage.

17. The memory device of claim 1, wherein the memory cell includes the pass transistor and the capacitor, and which capacitor is formed under the pass transistor.

18. The memory device of claim 1, wherein the memory cell including the pass transistor and the capacitor, where the pass transistor is formed from thin film polycrystalline silicon MOS transistor.

19. The memory device of claim 1, wherein the memory cell is formed on the peripheral circuits, such as the segment read circuit and the block read circuit.

20. The memory device of claim 1, wherein the memory cell is stacked over another memory cell.

* * * * *